United States Patent [19]
Ueda

[11] Patent Number: 6,127,856
[45] Date of Patent: *Oct. 3, 2000

[54] SAMPLE-AND-HOLD CIRCUIT OPERABLE AT A LOW VOLTAGE

[75] Inventor: Goro Ueda, Tokyo, Japan

[73] Assignee: NEC Corporation, Tokyo, Japan

[ * ] Notice: This patent is subject to a terminal disclaimer.

[21] Appl. No.: 08/998,383

[22] Filed: Dec. 24, 1997

[30] Foreign Application Priority Data

Dec. 28, 1996 [JP] Japan ................................. 8-359070

[51] Int. Cl.[7] .................................................. G11C 27/02
[52] U.S. Cl. ................................. 327/94; 327/96
[58] Field of Search .............................. 327/91, 93, 94, 327/96, 52, 53, 66

[56] References Cited

U.S. PATENT DOCUMENTS

| | | |
|---|---|---|
| 4,323,796 | 4/1982 | Lathrope ..................................... 327/93 |
| 4,922,131 | 5/1990 | Anderson et al. .......................... 327/66 |
| 5,036,219 | 7/1991 | Dingwall et al. .......................... 327/94 |
| 5,378,938 | 1/1995 | Birdsall et al. ............................. 327/94 |
| 5,473,273 | 12/1995 | Werner, Jr. et al. ....................... 327/94 |
| 5,818,295 | 10/1998 | Chimura et al. .......................... 327/561 |
| 5,825,167 | 10/1998 | Ryat ........................................ 323/312 |
| 5,844,433 | 12/1998 | Nishimura ................................. 327/94 |

*Primary Examiner*—My-Trang Nuton
*Attorney, Agent, or Firm*—Sughrue, Mion, Zinn, Macpeak & Seas, PLLC

[57] ABSTRACT

A sample-and-hold circuit configured with a low source voltage for assuring low power consumption. An input signal and an output signal are coupled to one side and to the other side of a current mirror circuit. The input signal is sample-held by a differential circuit adapted to cause the current to flow a desired current to the current mirror circuit and to perform switching of the current mirror circuit and sample clocks entered to the differential circuit. The sample-holding operation is feasible even with a lower voltage source.

30 Claims, 3 Drawing Sheets

SAMPLE-AND-HOLD CIRCUIT OPERABLE AT A LOW VOLTAGE

TECHNICAL FIELD OF THE INVENTION

This invention relates to a sample-and-hold circuit and, more particularly, to a sample-and-hold circuit of a circuit configuration suitable for operation at a low voltage source.

BACKGROUND OF THE INVENTION

A sample-and-hold circuit used in a liquid crystal display device is generally constructed by bi-polar transistors. Recently, the sample-and-hold circuit used in this field is required to operate at a lower voltage, such that it is necessary to simplify the circuit configuration and, in particular, to reduce the number of straightly stacked stages of transistors to enable low-voltage operation.

FIG. 2 shows an illustrative circuit configuration of this type of the conventional sample-and-hold circuit. Referring to FIG. 2, an input voltage Vin is entered to bases of transistors Q1, Q2 so that current flows through transistors Q5, Q1, Q3; Q2, Q7 and Q4 by sample clocks VCKH and VCKL entered to bases of transistors Q5 and Q7 to accumulate a voltage equal to the input voltage Vin in a holding capacitor C1.

Thus, the potentials VN1, VN2 of nodes N1, N2 are represented as $V_{N1}=Vin-VF$ $V_{N2}=Vin+VF$ respectively. In the above equation, VF denotes a forward base-emitter voltage.

The voltage Vin accumulated in the holding capacitor C1 is outputted via a voltage follower A1.

During holding, sample clocks VCKH and VCKL become higher or lower than reference voltage sources VRH and VRL entered to opposite ends of differential transistor pairs to turn off transistors Q5, Q7 so that the current ceases to flow through the transistors Q1, Q2, Q3 and Q4.

Thus, the current is supplied from current sources I3 and I4 to transistors Q9 and Q10 such that the potentials $V_{N1}$, $V_{N2}$ of the nodes N1, N2 become $V_{N1}=Vin+VF$ $V_{N2}=Vin-VF$ so that the base-to-emitter current paths of the transistors Q3 and Q4 are reverse-biased by 2 VF.

This holds charges accumulated in the holding capacitor C1 unchanged because the transistors Q3 and Q4 are completely cut off.

SUMMARY OF THE DISCLOSURE

The above-described conventional sample-and-hold circuit is made up of a number of stages of stacked bipolar transistors in the straight conformation or arrangement (straight stacking or straight cascade "Tate-zumi") between two power supplies. Thus, the source voltage Vcc has to be not less than the magnitude {[VF(forward base-to-emitter voltage)×four stages]+[two stages of constant current sources]+[input voltage range]} at the minimum thus offering an increased power consumption.

In the above-described conventional sample-and-hold circuit, switches for sample-holding are arranged vertically symmetrically of an input as a reference, thus requiring a number of stages of bi-polar transistors in the straight conformation. Therefore, the source voltage Vcc has to be set to a higher value to render it difficult to effectuate a low-voltage operation.

In view of the above-mentioned problem of the present invention, it is an object of the present invention to provide a sample-and-hold circuit that can be designed with a low source voltage to decrease power consumption.

Further objects of the present invention will become apparent in the entire disclosure.

The present invention provides a sample-and-hold circuit in which an input signal and an output are coupled to one side and the other side of a current mirror circuit, respectively. The input signal is sample-held by a differential circuit adapted to cause the current to flow in a desired amount to the current mirror circuit and to perform switching of the current mirror circuit and by sample clocks entered to the differential circuit. The sample-holding operation is feasible even with a lower voltage source.

According to a first aspect of the present invention, there is provided a sample-and-hold circuit characterized in that an input terminal is connected to one side of a current mirror circuit and an output terminal is connected to the opposite side of the current mirror circuit; the current mirror circuit is designed to flow a desired current, and there is provided means for switching the operation of said current mirror circuit. The switching means is connected to the input terminal of the current mirror circuit.

According to a second aspect, there is provided a sample-and-hold circuit in which an input terminal is connected to an output end of a current mirror circuit, to an opposite end of which is connected a holding capacitor. The sample-and-hold circuit comprises switching means for causing a desired current to flow in the current mirror circuit during sampling the input voltage entering said input terminal, the switching means operating for turning the current of the current mirror circuit off during holding the sampled input voltage.

According to a third aspect a sample-and-hold circuit comprises first and second current mirror circuits arranged facing each other between a high potential side power source and a low potential side power source. An input terminal is provided for entering an input signal voltage to an output end of the second current mirror circuit. A holding capacitor is connected to the other output end of the second current mirror circuit. Each output end of the second current mirror circuit makes up a current path with each corresponding output end of the first current mirror circuit. The current paths of the first current mirror circuit and the second current mirror circuit are controlled to be turned on or off depending on whether the input signals voltage entering the input terminal is being sampled or the holding capacitor is holding sampled voltage value of the input signal voltage.

According to a fourth aspect, the sample-and-hold circuit of the foregoing aspect further comprises a differential circuit having sample clock voltage and a reference voltage as differential inputs, an output current of the differential circuit being supplied to an input end of the first current mirror circuit, an output current from one output end of the first current mirror circuit being entered to an input end of the second current mirror circuit, the first and second current mirror circuits being on/off controlled depending on the relative magnitudes of the sample clock voltage and said reference voltage.

According to the present invention, as described above, such a high-speed sample-and-hold circuit can be implemented which can be operated at a lower voltage at a lower power consumption. The sample-and-hold circuit of the present invention can be applied to a wide range of applications including display devices, such as a liquid crystal display device, with great practical advantages.

PREFERRED EMBODIMENTS OF THE INVENTION

Figure 1:
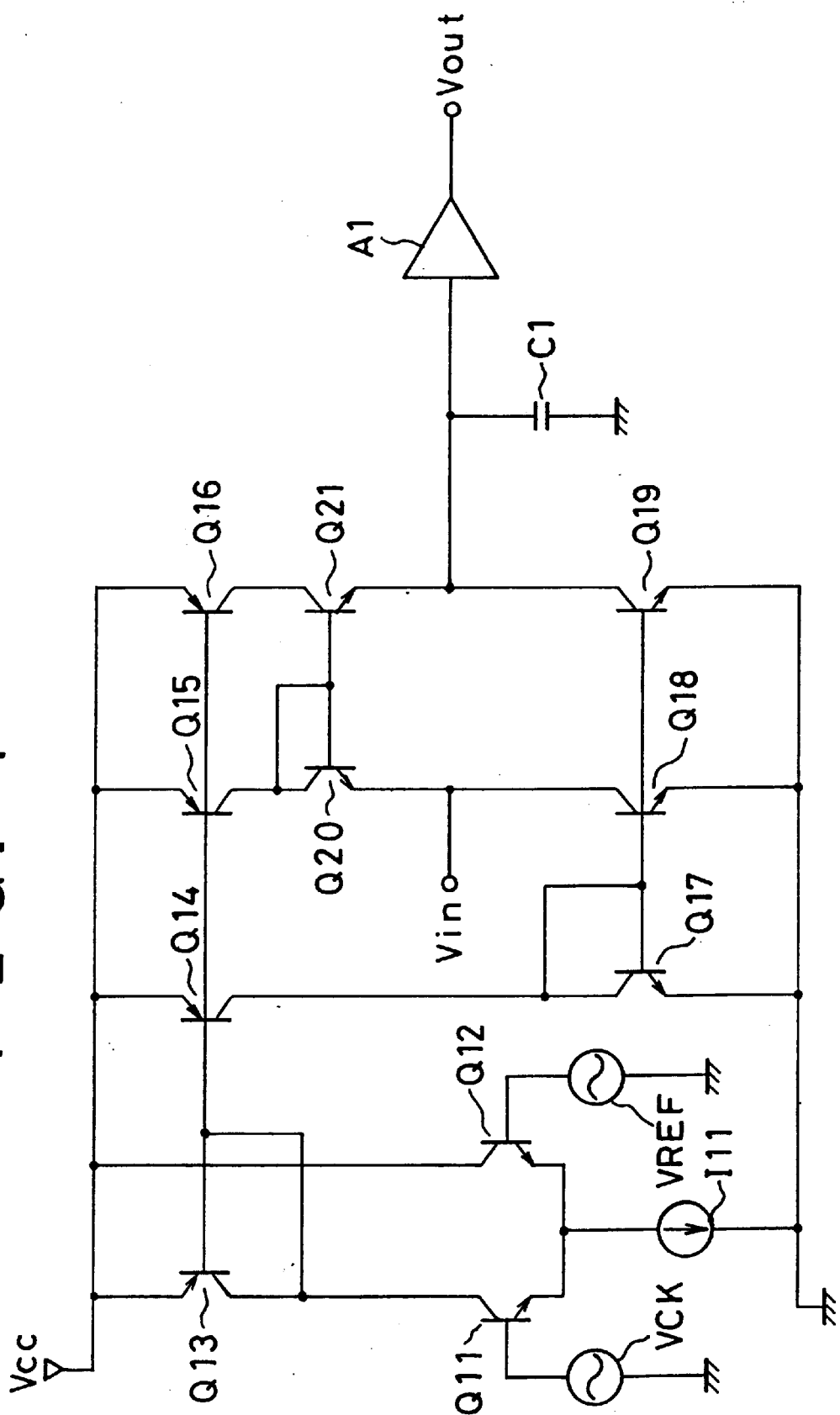
FIG. 1 shows a circuit configuration of an embodiment of the present invention.
Figure 3:
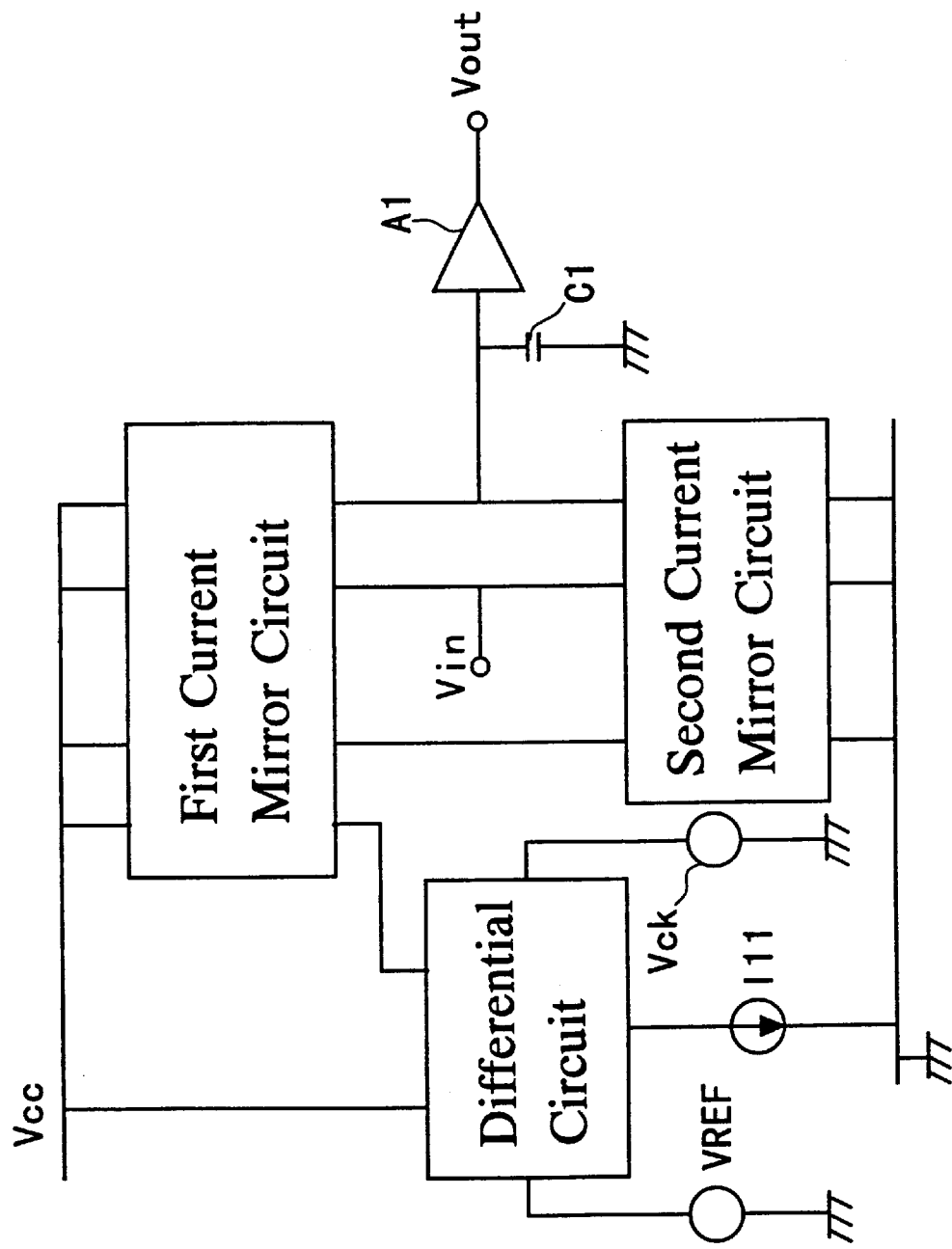
FIG. 3 shows a block diagram illustrating the basic structure of an embodiment of the present invention.

A preferred embodiment of the present invention will be hereinafter explained. FIG. 3 is an illustrative embodiment of the present invention, and FIG. 1 is a illustrative example of circuitry which may be used to implement the devices shown in FIG. 3. In the embodiment of the present invention, a first current mirror circuit (transistors Q13, Q14, Q15 and Q16 of FIG. 1) is arranged on the side of a high potential current source (Vcc side), whilst a second current mirror circuit (transistors Q17, Q18 and Q19 of FIG. 1) is arranged on the side of a low potential voltage source (GND). On one of the current supply ends (nodes) of the second current mirror circuit is connected an input terminal (Vin in FIG. 1) for entering an input voltage. On the opposite current supply end (node) of the second current mirror circuit and the first current mirror circuit is connected a holding capacitor (C1 of FIG. 1). During sampling of an input voltage (Vin in FIG. 1) entering the input terminal, the current is caused to flow across the first current mirror circuit and the second current mirror circuit, thereby recording an input voltage (Vin in FIG. 1) in the holding capacitor (C1 in FIG. 1), whereas, during holding, the current in the first current mirror circuit and the second current mirror circuit is turned off, with the holding capacitor (C1 in FIG. 1) holding a voltage value of (or corresponding to) the input voltage.

In the present embodiment, there is provided a differential circuit having sample clocks (VCK of FIG. 1) and a reference voltage (VREF of FIG. 1) as differential inputs. An output current of the differential circuit is supplied to an input end of the first current mirror circuit (transistor Q13 of FIG. 1), while an output current of one current supply end of the first current mirror circuit (transistor Q14 of FIG. 1) is entered to an input end of the second current mirror circuit (transistor Q17 of FIG. 1). The currents of the first current mirror circuit and the second current mirror circuit is controlled to be on or off depending on the relative magnitude of the sample clock voltage and the reference voltage.

In the embodiment of the present invention, it suffices if the source voltage Vcc is not less than {[VF (forward base-emitter voltage)×three stages]+[input voltage range]} such that low-voltage operation is feasible and the circuit configuration is simplified.

EXAMPLES

Referring to the drawings, a preferred example of the present invention will be explained in detail. FIG. 1 shows the circuit configuration of the present invention.

Referring to FIG. 1, an input voltage Vin is connected to an emitter of a transistor Q20, while the base of a transistor Q20 is connected in common to the base of a transistor Q21, the emitter of which is connected to a holding capacitor C1.

The collector of the transistor Q20 is connected to the base of the same. Thus the transistors Q20 and Q21 constitute a sub-current mirror circuit.

The collectors of the transistors Q20 and Q21 are connected to an output end of the first current mirror circuit (transistors Q15, Q16), whilst the emitters of the transistors Q20 and Q21 are connected to an output end of the second current mirror circuit (transistors Q18, Q19). The first current mirror circuit is made up of transistors Q13 to Q16, connected in the common base configuration and having emitters connected to the high potential side source Vcc. The base and the collector of the transistor Q13 are connected to each other to constitute a current input end, while the collectors of the transistors Q13 to Q16 constitute current supply ends (output ends) of the first current mirror circuit. The second current mirror circuit is made up of transistors Q17, Q18 and Q19 connected in the common base configuration and having emitters connected to the low potential side source GND. The base and the collector of the transistor Q17 are connected to each other to constitute a current supply end, while the collector of the transistor Q17 is connected to the current supply end of the first current mirror circuit (collector of the transistor Q14). The collectors of the transistors Q18 and Q19 constitute the current supplying (receiving) ends of the second current mirror circuit.

The differential circuit, constituting the basic current supply source of the first and second current mirror circuits, is made up of a differential transistor pair Q11, Q12, the emitters of which are connected in common and to the current source I11. The collector of the transistor Q11 constituting the differential transistor pair is connected to the current input end of the first current mirror circuit (collector of transistor Q13). A current corresponding to the collector current of this transistor Q11 is mirrored to the output end of the first current mirror circuit and outputted as a discharge current, while being mirrored (or mirror-reflectedwise folded) by the second current mirror circuit so as to be supplied at its output end as a sink current.

The base of the transistor Q11, constituting the differential pair transistor, is connected to a sample clock voltage source VCK, whilst the base of the transistor Q12 is connected to the reference voltage VREF.

The operation of the present invention will now be explained.

As sample clocks VCK, entered to the differential circuit, periodic pulse signals are entered. The differential pair transistors Q11 and Q12 are turned on and off by the voltage difference from the reference voltage source VREF.

If the voltage of the sample clocks VCK is higher than the reference voltage source VREF, the transistor Q11 is turned on to cause the current to flow therein. The current also flows in a transistor Q13 connected to the collector of the transistor Q11.

If the current flows in the transistor Q13, this current is mirrored in the transistors Q14, Q15 and Q16 connected in the common base configuration with the transistor Q13 for making up the first current mirror circuit.

The current also flows across the transistor Q17 connected to the collector of the transistor Q14 so that this current is mirrored in the transistors Q18 and Q19 connected in the common base configuration to the transistor Q17 for making up the second current mirror circuit.

Thus, the voltage Vin which is the same as the input voltage is accumulated via transistors Q20 and Q21 in the holding capacitor C1.

If the voltage of the sample clocks VCK is lower than the reference voltage VREF, the transistor Q11 turned off so that the transistor Q13 connected to the collector of the transistor Q11 is also cut off to cause the current flow to cease. The transistors Q14, Q15 and Q16 connected in the common base configuration to the transistor Q13 for making up the first current mirror circuit are similarly cut off so that current ceases to flow therein.

As for the transistor Q17 connected to the collector of the transistor Q14, the current is ceased to flow and the same applies to the transistors Q18 and Q19 connected in the common base configuration with the transistor Q17.

Thus, the transistors Q20 and Q21 become non-current-conducting such that the voltage Vin held in the capacitor C1 is held unchanged. The voltage Vin, held by this holding capacitor C1, is outputted via a voltage follower A1.

Figure 2:
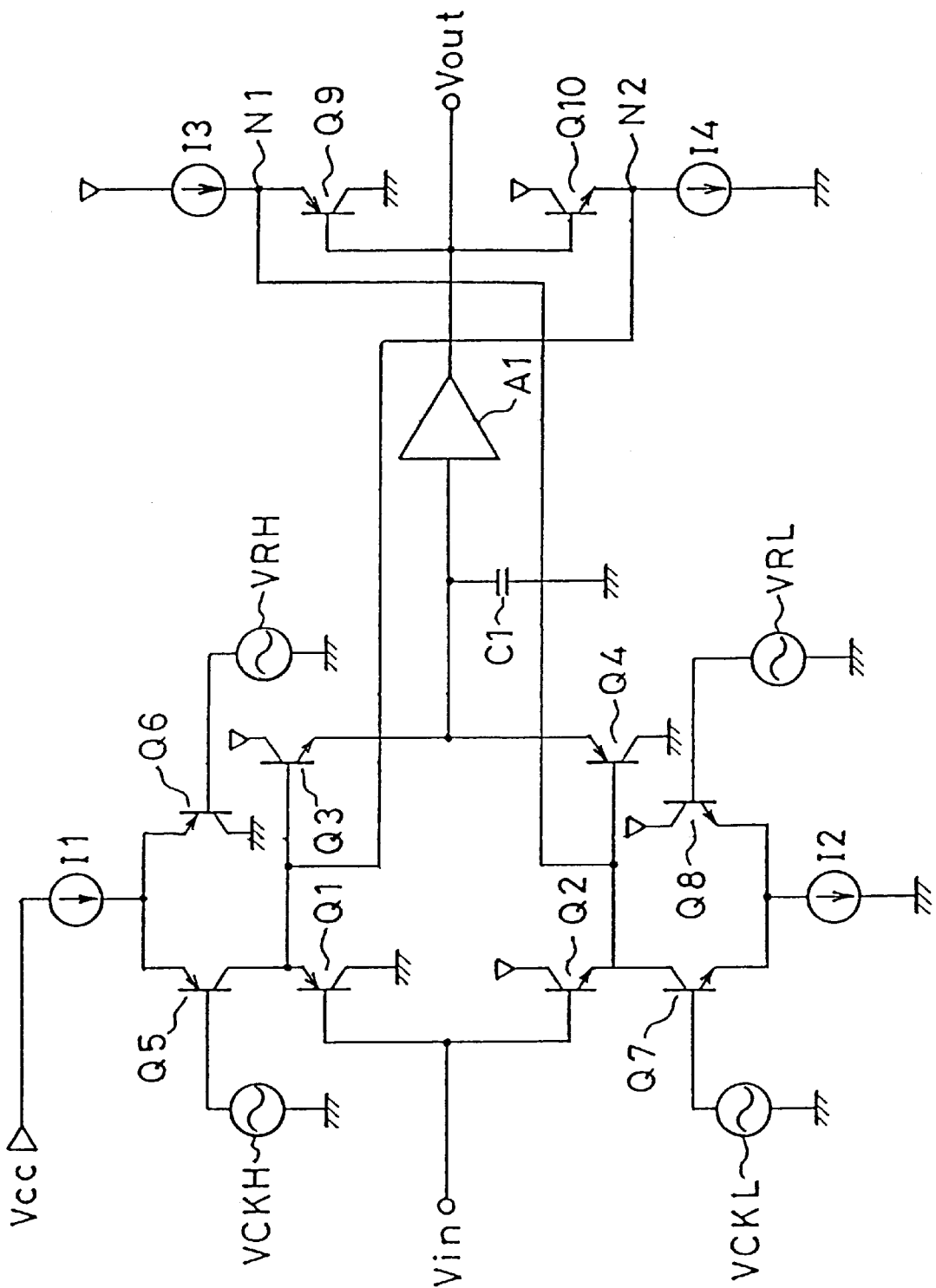
FIG. 2 shows an example of a circuit configuration of a conventional sample-and-hold circuit.

It is seen from above that the source voltage VCC not less than {[VF (forward base-emitter voltage)×three stages]+[input voltage range]} suffices thus enabling the source voltage Vcc to be lowered by a value corresponding to three VF stages as compared to the conventional technique shown in FIG. 2.

Thus, the sample-and-hold circuit embodying the present invention can be operated by a low source voltage thus realizing a high-speed sample-and-hold circuit of a bi-polar configuration by low power consumption. The sample-and-hold circuit of the present invention can be applied with advantage to a wide range of applications including a display device, such as a liquid crystal display device.

It should be noted that modifications way be done without departing the concept and scope of the present invention as fully disclosed in the entire application within the appended claims.

What is claimed is:

1. A sample-and-hold circuit comprising:
   a current mirror circuit having first terminal connected to one side of said current mirror circuit and a second terminal connected to an opposite side of said current mirror circuit, wherein said current mirror circuit is designated to flow a desired current therein;
   an input terminal that receives an input voltage and that is connected to said first terminal of said current mirror circuit to enable said input voltage to be sampled by said sample-and-hold circuit;
   a switching circuit that generates a switching signal that switches the operation of said current mirror circuit such that said desired current flows through said current mirror circuit during a sampling mode to sample said input voltage and does not flow through said current mirror circuit during a holding mode, wherein said switching signal is supplied to said second terminal of said current mirror circuit; and
   a second current mirror couple to said input terminal.

2. A sample-and-hold circuit comprising:
   a current mirror circuit in which an input terminal is connected to first terminal of the current mirror circuit, wherein said input terminal inputs an input voltage that is sampled by said sample-and-hold circuit;
   a holding capacitor connected to a second terminal of the current mirror circuit;
   a switching circuit that causes a desired current to flow in said current mirror circuit during a sampling of said input voltage input to said input terminal, said switching means operating for turning off the current of the current mirror circuit when holding the input voltage that has been sampled via said holding capacitor, wherein said switching circuit is connected to a third terminal of said current mirror circuit; and
   a second current mirror circuit coupled to said input terminal.

3. A sample-and-hold circuit comprising:
   first and second current mirror circuits arranged and connected together facing each other between a high potential side power source and a low potential side power source;
   an input terminal for inputting an input signal voltage to a first output end of said second current mirror circuit;
   a holding capacitor connected to a second output end of the second current mirror circuit;
   wherein said first output end of the second current mirror circuit and a corresponding first output end of said first current mirror circuit form a first current path and said second output end of said second current mirror circuit and a corresponding second output end of the first current mirror circuit form a second current path; and
   wherein said first and second current paths are controlled to be turned on or off depending on whether the input signal voltage input to the input terminal is being sampled or the holding capacitor is holding a sampled voltage value of the input signal voltage.

4. The sample-and-hold circuit as defined in claim 3, which further comprises:
   a differential circuit having a sample clock voltage and a reference voltage as differential inputs,
   wherein an output current of said differential circuit is supplied to an input end of said first current mirror circuit, an output current from a third output end of said first current mirror circuit is input to an input end of said second current mirror circuit, and said first and second current mirror circuits are on/off controlled depending on relative magnitudes of the sample clock voltage and said reference voltage.

5. The sample-and-hold circuit as defined in claim 3, further comprising a sub-current-mirror circuit that includes paired transistors having in-common-connected bases and that are disposed between the first current mirror circuit and the second current mirror circuit, with emitters of the paired transistors of the sub-current-mirror circuit being connected to corresponding collectors of the second mirror current circuit, respectively, whilst collectors of the paired transistors of the sub-current-mirror circuit are connected to corresponding collectors of the first mirror current circuit.

6. The sample-and-hold circuit as claimed in claim 3, wherein said first and second current paths are simultaneously turned on when the input signal voltage is being sampled.

7. A sample-and-hold circuit comprising:
   an input voltage terminal which inputs an input voltage signal;
   a first current mirror circuit having a first terminal coupled to said input voltage terminal for receiving said input voltage signal;
   a control circuit coupled to a control terminal of said first current mirror circuit which causes a first current to flow in said first current mirror circuit to enable a sampled voltage corresponding to said input voltage signal to be sampled and which causes said first current not to flow in said first current mirror to enable said sampled voltage to be held; and
   a second current mirror circuit that has a second terminal that is coupled to said input voltage terminal; and
   a second current mirror that has a second terminal that is coupled to said input voltage terminal.

8. The sample-and-hold circuit as claimed in claim 7, further comprising:
a holding circuit coupled to said first current mirror circuit, wherein said holding circuit holds said sampled voltage when said control circuit causes current not to flow in said first current mirror circuit.

9. The sample-and-hold circuit as claimed in claim 8,
wherein said second current mirror circuit is coupled to said holding circuit, and
wherein said control circuit causes a second current to flow in said second current mirror circuit to enable said sampled voltage to be sampled and causes said second current not to flow in said second current mirror to enable said sampled voltage to be held by said holding circuit.

10. The sample-and-hold circuit as claimed in claim 9, wherein said holding circuit comprises a capacitor coupled to said first and second current mirror circuits.

11. The sample-and-hold circuit as claimed in claim 9, wherein said first current mirror circuit comprises a third terminal and said second current mirror circuit comprises a fourth terminal,
wherein said third terminal is coupled to fourth terminal, and
wherein a control current is output from said third terminal to said fourth terminal when said first current is flowing in said first current mirror circuit and causes said second current to flow in said second current mirror circuit.

12. The sample-and-hold circuit as claimed in claim 11, wherein said first current mirror circuit comprises a fifth terminal coupled to said holding circuit and said second current mirror circuit comprises a sixth terminal coupled to said holding circuit.

13. The sample-and-hold circuit as claimed in claim 9, wherein said current flows through said first and second terminals when said first current flows in said first current mirror circuit.

14. The sample-and-hold circuit as claimed in claim 7, wherein
said control circuit comprises a differential circuit which inputs a first voltage and a second voltage,
wherein said differential circuit outputs a control current to said control terminal to cause said first current to flow in said first current mirror circuit when said first and second voltages have a first predetermined relationship, and
wherein said differential circuit outputs said control current to said control terminal to cause said first current not to flow in said first current mirror circuit when said first and second voltages have a second predetermined relationship.

15. The sample-and-hold circuit as claimed in claim 14, wherein said first voltage is a sample clock voltage and said second voltage is a reference voltage.

16. A sample-and-hold circuit comprising:
an input voltage terminal which inputs an input voltage;
a holding circuit which holds a sampled voltage corresponding to said input voltage;
a first current mirror circuit having a first control terminal, a first current terminal, a second current terminal, and a third current terminal, wherein said second current terminal is coupled to said input voltage terminal and said third current terminal is coupled to said holding circuit; and
a second current mirror circuit having a second control terminal, a fourth current terminal, and a fifth current terminal, wherein said second control terminal is coupled to said first current terminal, said fourth current terminal is coupled to said input voltage terminal, and said fifth current terminal is coupled to said holding circuit.

17. The sample-and-hold circuit as claimed in claim 16, wherein current flows through said first current terminal, said second current terminal, said third current terminal, and said second control terminal when a control current supplied to said first control terminal has a first value and current does not flow through said first current terminal, said second current terminal, said third current terminal, and said second control terminal when said control current has a second value, and
wherein current flows through said fourth current terminal and said fifth current terminal when current flows through said second control terminal.

18. The sample-and-hold circuit as claimed in claim 17, wherein said sampled voltage is supplied to said holding circuit when current flows through said second current terminal, said third current terminal, said fourth current terminal, and said fifth current terminal, and
wherein said sampled voltage is held in said holding circuit when current does not flow through said second current terminal, said third current terminal, said fourth current terminal, and said fifth current terminal.

19. The sample-and-hold circuit as claimed in claim 18, wherein said holding circuit comprises a capacitor.

20. The sample-and-hold circuit as claimed in claim 18, further comprising:
a control circuit which is coupled to said first current mirror circuit and which inputs a sampling voltage and a reference voltage,
wherein said control circuit outputs said control current having said first value when said sampling voltage and said reference voltage have a first predetermined relationship and outputs said control input having said second value when said sampling voltage and said reference voltage have a second predetermined relationship.

21. The sample-and-hold circuit as claimed in claim 18, wherein said first current mirror circuit comprises:
a first transistor having a first base and a first output coupled to said first control terminal and having a first input coupled to a first voltage source;
a second transistor having a second base coupled to said first control terminal, a second output coupled to said first current terminal, and a second input coupled to said first voltage source;
a third transistor having a third base coupled to said first control terminal, a third output coupled to said second current terminal, and a third input coupled to said first voltage source; and
a fourth transistor having a fourth base coupled to said first control terminal, a fourth output coupled to said third current terminal, and a fourth input coupled to said first voltage source.

22. The sample-and-hold circuit as claimed in claim 21, wherein said first current mirror circuit comprises:
a sub current mirror circuit comprising:
a fifth transistor having a fifth base and a fifth input coupled to said third output of said third transistor and having a fifth output coupled to said second current terminal; and a sixth transistor having a sixth base coupled to said third output of said third transistor, a sixth input coupled to said fourth output of said fourth transistor, and a sixth output coupled to said third current terminal.

23. The sample-and-hold circuit as claimed in claim 22, wherein said second current mirror circuit comprises:

a seventh transistor having a seventh base and a seventh input coupled to said second control terminal and having a seventh output coupled to a second voltage source;

an eighth transistor having an eighth base coupled to said second control terminal, an eighth input coupled to said fourth current terminal, and a eighth output coupled to said second voltage source; and a ninth transistor having a ninth base coupled to said second control terminal, a ninth input coupled to said fifth current terminal, and a ninth output coupled to said second voltage source.

24. The sample-and-hold circuit as claimed in claim 23, wherein said holding circuit comprises a capacitor.

25. The sample-and-hold circuit as claimed in claim 18, wherein said second current mirror circuit comprises:

a first transistor having a first base and a first input coupled to said second control terminal and having a first output coupled to a first voltage source;

a second transistor having a second base coupled to said second control terminal, a second input coupled to said fourth current terminal, and a second output coupled to said first voltage source; and a third transistor having a third base coupled to said second control terminal, a third input coupled to said fifth current terminal, and a third output coupled to said first voltage source.

26. A sample-and-hold circuit comprising:

an input voltage terminal which inputs an input voltage;

a holding circuit which holds a sampled voltage corresponding to said input voltage;

a first current mirror circuit having a first current terminal and a second current terminal wherein said first current terminal is coupled to said input voltage terminal and said second current terminal is coupled to said holding circuit;

a second current mirror circuit having a third current terminal and a fourth current terminal, wherein said third current terminal is coupled to said input voltage terminal and said fourth current terminal is coupled to said holding circuit; and a control circuit, coupled to said first current mirror circuit, that simultaneously causes a first current to flow from said first terminal to said third terminal and a second current to flow from said second terminal to said fourth terminal to enable said sampled voltage corresponding to said input voltage to be sampled.

27. The sample-and-hold circuit as claimed in claim 26, wherein said first current mirror circuit comprises a fifth terminal and said second current mirror circuit comprises a first control terminal coupled to said fifth terminal, and wherein said second current mirror circuit is activated when current flows from said fifth terminal to said first control terminal.

28. The sample-and-hold circuit as claimed in claim 27, wherein said first current mirror circuit comprises a second control terminal that inputs a control signal from said control circuit, and wherein said first current mirror circuit is activated when said control signal has a first value.

29. The sample-and-hold circuit as claimed in claim 28, wherein said control circuit inputs a sampling voltage and a reference voltage, wherein said control circuit outputs said control signal having said first value when said sampling voltage and said reference voltage have a first predetermined relationship and outputs said control signal having a second value when said sampling voltage and said reference voltage have a second predetermined relationship, and wherein said first current mirror circuit is deactivated when said control signal has said second value.

30. The sample-and-hold circuit as claimed in claim 26, wherein said first current mirror circuit comprises a first control terminal that inputs a control signal from said control circuit, and wherein said first current mirror circuit is activated when said control signal has a first value.

* * * * *